(12) United States Patent
Kurosaki et al.

(10) Patent No.: US 10,497,852 B2
(45) Date of Patent: Dec. 3, 2019

(54) THERMOELECTRIC CONVERSION MATERIAL AND THERMOELECTRIC CONVERSION MODULE

(71) Applicant: Hitachi, Ltd., Chiyoda-ku, Tokyo (JP)

(72) Inventors: Yosuke Kurosaki, Tokyo (JP); Shin Yabuuchi, Tokyo (JP); Jyun Hayakawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/914,500

(22) Filed: Mar. 7, 2018

(65) Prior Publication Data

US 2018/0331272 A1 Nov. 15, 2018

(30) Foreign Application Priority Data

May 10, 2017 (JP) .................... 2017-094304

(51) Int. Cl.
*H01L 35/32* (2006.01)
*H01L 35/22* (2006.01)
*H01L 35/16* (2006.01)
*H01L 35/18* (2006.01)
*H01L 35/08* (2006.01)

(52) U.S. Cl.
CPC .............. *H01L 35/32* (2013.01); *H01L 35/08* (2013.01); *H01L 35/16* (2013.01); *H01L 35/18* (2013.01); *H01L 35/22* (2013.01)

(58) Field of Classification Search
CPC ......... H01L 35/32; H01L 35/08; H01L 35/16; H01L 35/18; H01L 35/22
USPC .......................................................... 136/236
See application file for complete search history.

(56) References Cited

U.S. PATENT DOCUMENTS

2013/0269739 A1* 10/2013 Hwang ................ H01L 35/16
136/205

FOREIGN PATENT DOCUMENTS

| JP | 2009-194085 A | | 8/2009 |
|---|---|---|---|
| JP | 2013-008747 | * | 1/2013 |
| JP | 2013-8747 A | | 1/2013 |
| JP | 2015-225951 A | | 12/2015 |

* cited by examiner

*Primary Examiner* — Jayne L Mershon
(74) *Attorney, Agent, or Firm* — Crowell & Moring LLP

(57) ABSTRACT

A thermoelectric conversion material includes a matrix phase configured from a semiconductor. A first grain-boundary phase and a second grain-boundary phase are provided at a grain boundary of the matrix phase. The first grain-boundary phase is configured from a material which does not form a compound with the matrix phase by a eutectic reaction, a eutectoid reaction, a peritectic reaction, a peritectoid reaction, an eccentric reaction, or a segregation reaction. The second grain-boundary phase is configured from a material having resistance which is lower than that of the matrix phase or the first grain-boundary phase. A ratio of a volume of the second grain-boundary phase to a volume of the first grain-boundary phase is smaller than 1.

11 Claims, 6 Drawing Sheets

[FIG. 1]
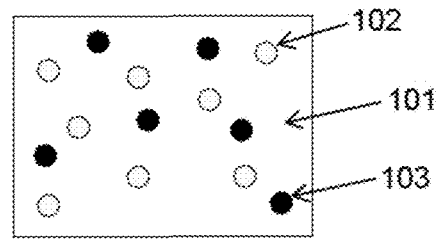
[FIG. 2A]
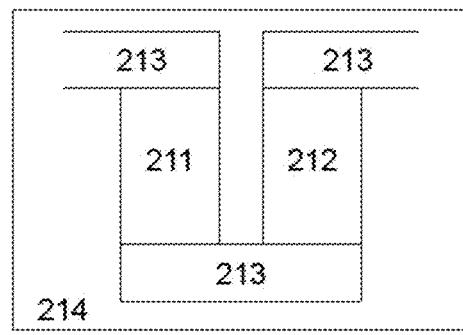
[FIG. 2B]
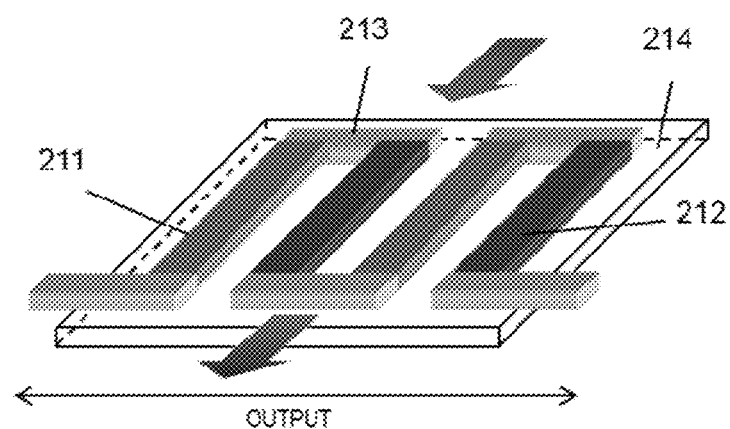

[FIG. 3]
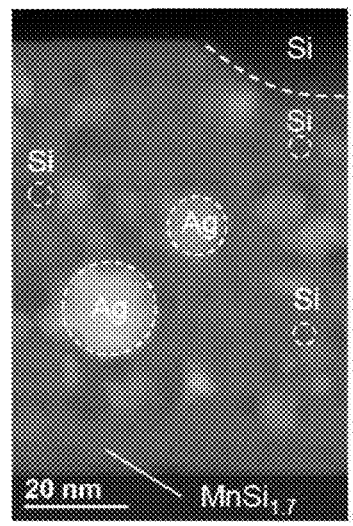
[FIG. 4]
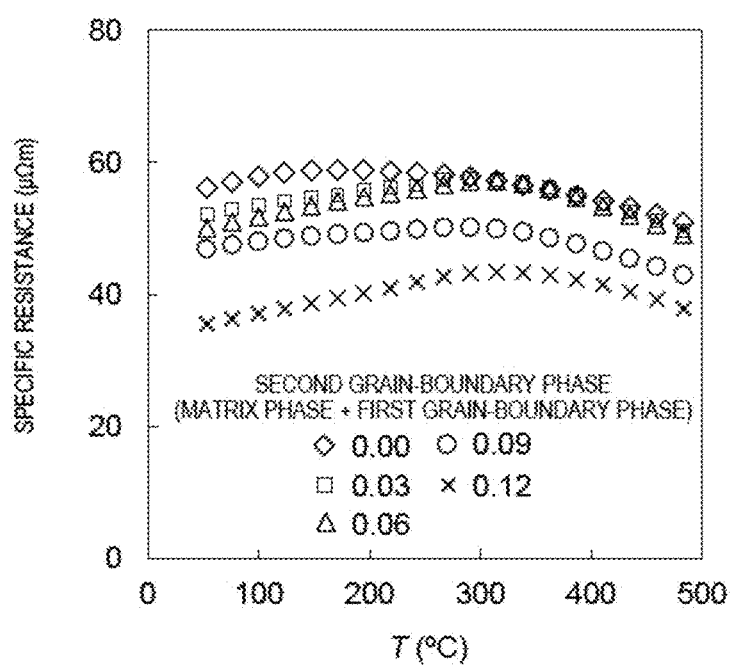

[FIG. 5]
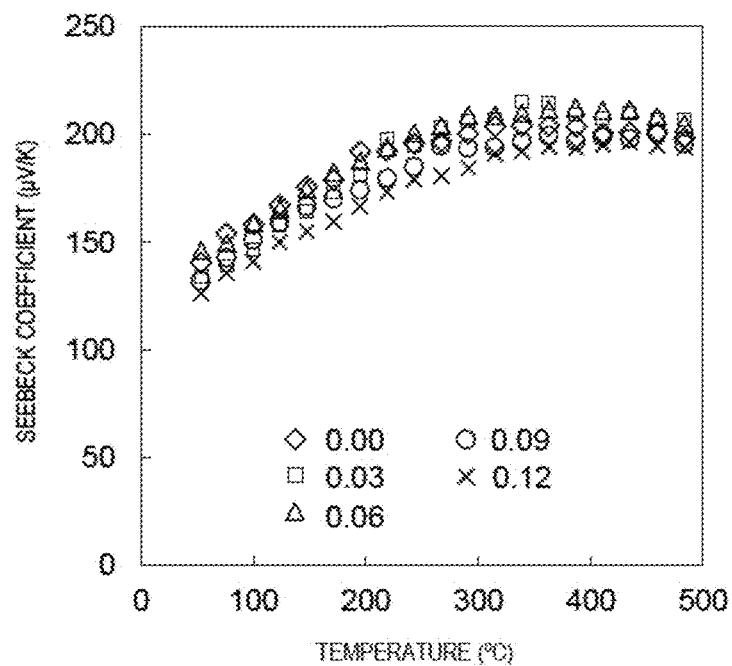
[FIG. 6]
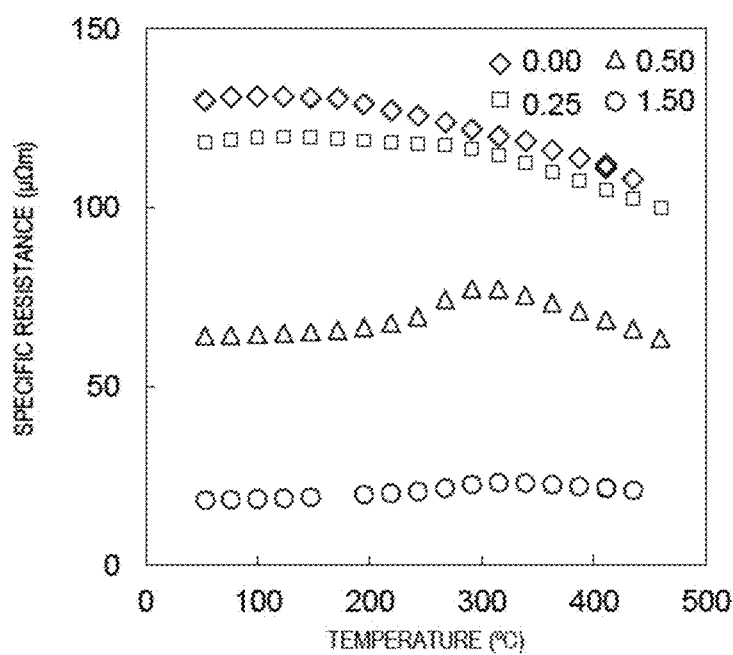

[FIG. 7]
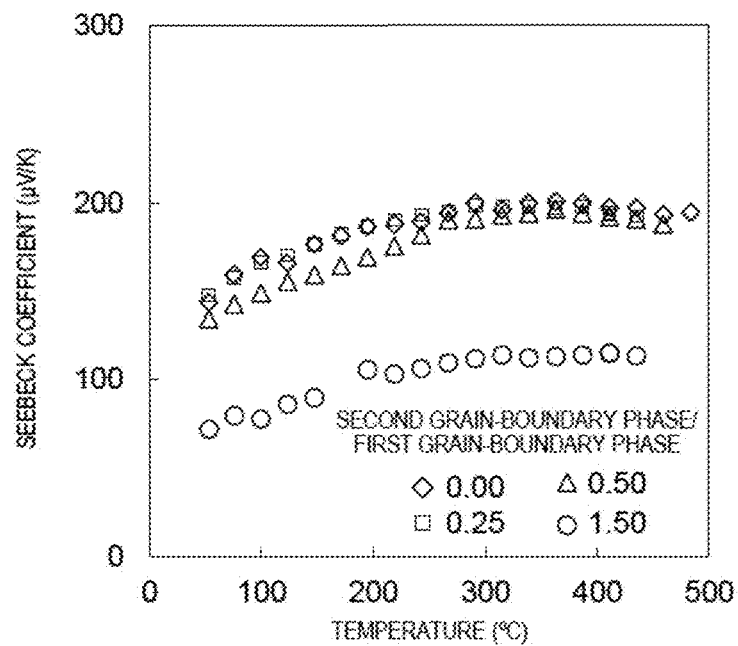
[FIG. 8]
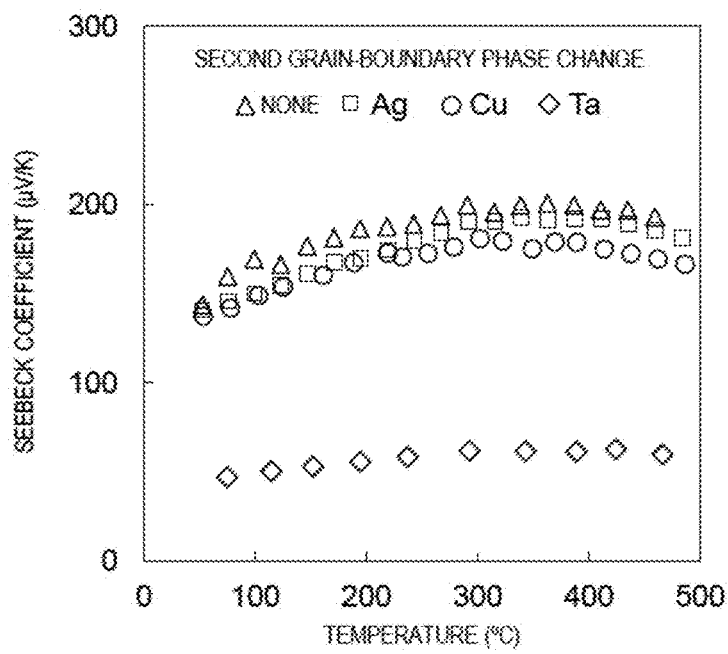

[FIG. 9A]
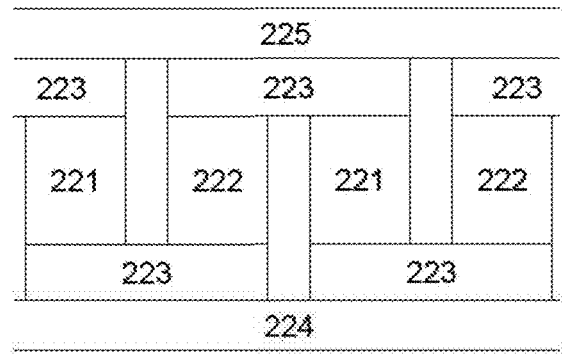
[FIG. 9B]
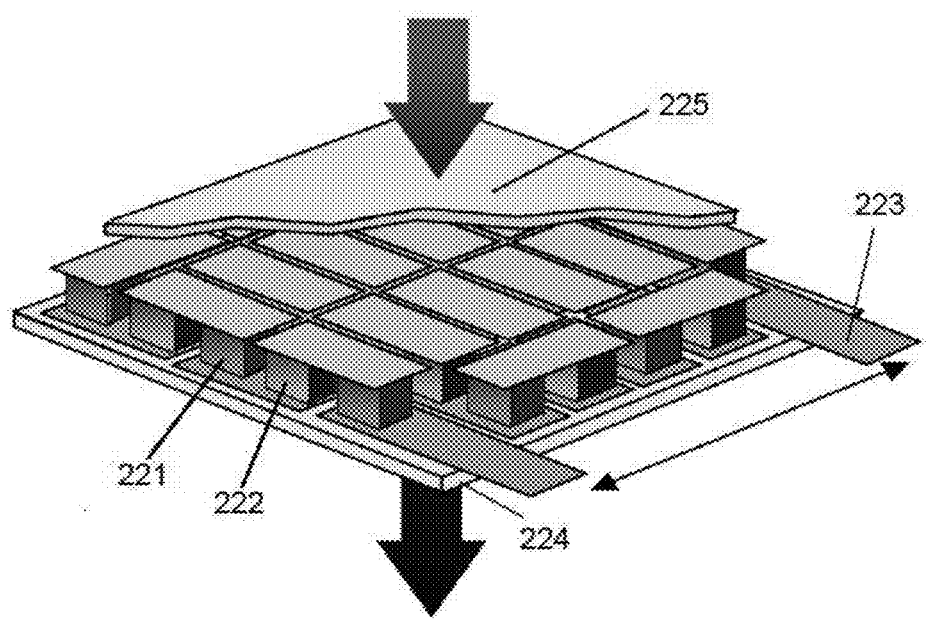

[FIG. 10]
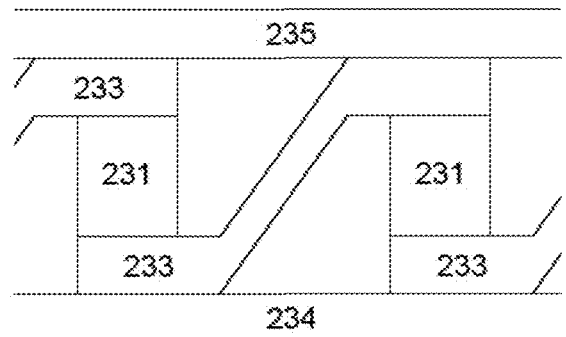
[FIG. 11]
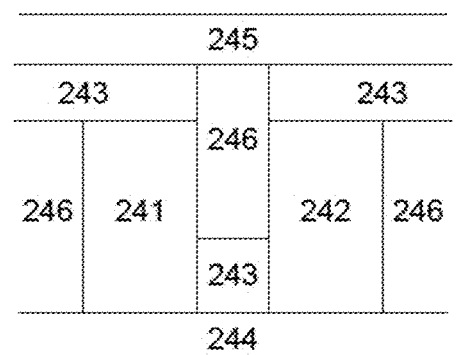
[FIG. 12]
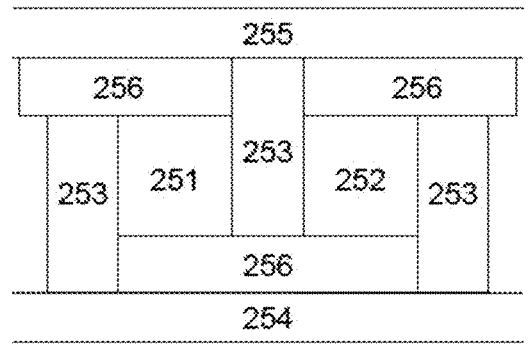

THERMOELECTRIC CONVERSION MATERIAL AND THERMOELECTRIC CONVERSION MODULE

CLAIM OF PRIORITY

The present application claims priority from Japanese patent application JP 2017-094304 filed on May 10, 2017, the content of which is hereby incorporated by reference into this application.

BACKGROUND OF THE INVENTION

Field of the Invention

The present invention relates to a thermoelectric conversion material and a thermoelectric conversion module using the same.

Background Art

In recent years, research and development relating to the effective use of energy have been actively performed in order to solve social problems relating to environmental pollution, mass consumption and disposal of energy, and depletion of resources. In these research and development, about 60% of the energy which is finally consumed in industrial, consumer and transportation sectors from primary energy sources including coal and petroleum is disposed as thermal energy. Thus, development of a technology of reusing the unused heat has been required. In particular, a waste heat-power conversion technology is one of the biggest demands. A thermoelectric conversion system using the Seebeck effect is provided as one of technologies for realizing the waste heat-power conversion. The thermoelectric conversion system is highly versatile because the thermoelectric conversion system can be used with scalability and turbine-lessness.

A thermoelectric conversion module constituting the thermoelectric conversion system is brought close to a heat source, and a temperature difference occurs between the upper portion and the lower portion of the thermoelectric conversion module, thereby converting heat into electric power. The thermoelectric conversion module is configured by p-type and n-type thermoelectric conversion materials and electrodes. Thermoelectric conversion efficiency of the module highly depends on the thermoelectric conversion materials. Thus, in order to improve the thermoelectric conversion efficiency, it is necessary that thermoelectric performance of a thermoelectric conversion material is improved. The thermoelectric performance of a thermoelectric conversion material, which is obtained by using the Seebeck effect is evaluated by using a dimensionless performance index ZT which is generally expressed by Expression (1).

[Expression 1]

$$ZT = \frac{S^2 T}{\rho \kappa} = \frac{S^2 T}{\rho(\kappa_e + \kappa_{ph})} \quad (1)$$

In Expression (1), S indicates a Seebeck coefficient, T indicates an absolute temperature, $\rho$ indicates specific resistance, $\kappa$ indicates thermal conductivity, $\kappa_e$ indicates thermal conductivity by carrier, and $\kappa_{ph}$ indicates thermal conductivity by lattices. As the performance index ZT is increased, the thermoelectric conversion efficiency of a thermoelectric conversion module is improved. Thus, producing a thermoelectric conversion material having a large performance index ZT is necessary.

As clear from Expression (1), it is understood that the Seebeck coefficient S may be high and the specific resistance $\rho$ and the thermal conductivity $\kappa$ may be low, in order to increase the performance index ZT of a thermoelectric conversion material. However, since the above-described parameters are generally correlated with each other, the above-described parameters have a trade-off relationship, for example, that, as the number of carriers is increased, the Seebeck coefficient S and the specific resistance $\rho$ are decreased and the thermal conductivity $\kappa_e$ is increased. Therefore, a semiconductor is generally used as a thermoelectric conversion material. Among the parameters, the thermal conductivity $\kappa_{ph}$ is independent from the above-described parameters in principle, and can be reduced even by structure control using heterogeneous materials. Thus, reducing thermal conductivity $\kappa_{ph}$ is effective for increasing the performance index ZT. Accordingly, in order to solve the above trade-off for putting a thermoelectric conversion system into practical use, material design and structural design of a material, which are made for increasing an output factor PF in a state where the thermal conductivity $\kappa_{ph}$ is reduced by structure control are required. The output factor PF is defined by Expression (2).

[Expression 2]

$$PF = \frac{S^2}{\rho} \quad (2)$$

It is known that a thermoelectric conversion material having a composite material structure which is obtained by combining heterogeneous materials is effective for reducing the thermal conductivity $\kappa_{ph}$ of a thermoelectric conversion material. In order to prepare a thermoelectric conversion material having a composite material structure, in particular, selecting a group of materials which do not form a compound with each other by a eutectic reaction, a eutectoid reaction, a peritectic reaction, a peritectoid reaction, an eccentric reaction, or a segregation reaction is effective.

A method of reducing the specific resistance $\rho$ by adding a metal material is provided for increasing the output factor PF. For example, JP-A-2009-194085 discloses a method of performing doping into a matrix phase so as to increase carrier density. JP-A-2013-8747 discloses a method of using metal having small specific resistance $\rho$, in a grain-boundary phase. JP-A-2015-225951 discloses a method of adjusting a ratio between a matrix phase and a grain-boundary phase so as to increase the Seebeck coefficient S. However, in the method disclosed in JP-A-2015-225951, it is difficult to increase the output factor PF because the specific resistance $\rho$ is also increased.

SUMMARY OF THE INVENTION

As described above, adding a metal material is effective for reducing specific resistance $\rho$ of a thermoelectric conversion material having a composite material structure in which reducing thermal conductivity can be expected.

Examination was performed on the technologies disclosed in JP-A-2009-194085 and JP-A-2013-8747, as future thermoelectric conversion materials.

The thermoelectric conversion material was examined in an aspect of performance thereof. As a result, in JP-A-2009-194085, it is understood that, since the Seebeck coefficient S of the composite material structure is strongly influenced by the matrix phase, the Seebeck coefficient S of the composite material structure may be largely decreased by reducing the Seebeck coefficient S of the matrix phase. In JP-A-2013-8747, the followings are understood. That is, it is known that a current path is formed by bonding grain-boundary phases of metal to each other, and the Seebeck coefficient S of metal is generally much lower than that of a semiconductor. Thus, as a result, the Seebeck coefficient S of the composite material structure may be largely decreased.

An object of the present invention is to provide a thermoelectric conversion material in which specific resistance is low and a Seebeck coefficient is not decreased in a composite material structure in which reducing thermal conductivity can be expected, and a thermoelectric conversion module using the thermoelectric conversion material.

The representative example of the inventions disclosed in this application is as follows. That is, a thermoelectric conversion material includes a matrix phase configured from a semiconductor. A first grain-boundary phase and a second grain-boundary phase are provided at a grain boundary of the matrix phase. The first grain-boundary phase is configured from a material which does not form a compound with the matrix phase by a eutectic reaction, a eutectoid reaction, a peritectic reaction, a peritectoid reaction, an eccentric reaction, or a segregation reaction. The second grain-boundary phase is configured from a material having resistance which is lower than that of the matrix phase or the first grain-boundary phase. A ratio of a volume of the second grain-boundary phase to a volume of the first grain-boundary phase is smaller than 1.

According to the present invention, it is possible to provide a thermoelectric conversion material in which it is possible to maintain a Seebeck coefficient while electric resistance is reduced, even in a composite material structure in which reducing thermal conductivity can be expected, and a thermoelectric conversion module using the same.

BRIEF DESCRIPTION OF THE DRAWINGS

FIG. 1 is a sectional view schematically illustrating a thermoelectric conversion material according to the present invention.

FIG. 2A is a sectional view schematically illustrating a main portion (thermoelectric conversion unit) of a thermoelectric conversion module in Example 1.

FIG. 2B is a perspective view schematically illustrating the thermoelectric conversion module in Example 1.

FIG. 3 is a diagram illustrating a sectional HAADF-STEM image of a thin film produced in Example 1.

FIG. 4 is a graph illustrating dependency of the thin film produced in Example 1, between a change of specific resistance with a temperature and an amount of a second grain-boundary phase.

FIG. 5 is a graph illustrating dependency of the thin film produced in Example 1, between a change of a Seebeck coefficient S with a temperature and the amount of the second grain-boundary phase.

FIG. 6 is a graph illustrating dependency of the thin film produced in Example 1, between the change of specific resistance ρ with the temperature and the amount of the second grain-boundary phase.

FIG. 7 is a graph illustrating dependency of the thin film produced in Example 1, between the change of the Seebeck coefficient S with the temperature and the amount of the second grain-boundary phase.

FIG. 8 is a graph illustrating dependency between the Seebeck coefficient and the temperature, for each kind of material constituting the second grain-boundary phase included in the thermoelectric conversion material in Example 1.

FIG. 9A is a sectional view schematically illustrating a main portion of a thermoelectric conversion module in Example 2.

FIG. 9B is a perspective view schematically illustrating the thermoelectric conversion module in Example 2.

FIG. 10 is a sectional view schematically illustrating a main portion of a thermoelectric conversion module in Example 3.

FIG. 11 is a sectional view schematically illustrating a main portion of a thermoelectric conversion module in Example 4.

FIG. 12 is a sectional view schematically illustrating a main portion of a thermoelectric conversion module in Example 5.

DETAILED DESCRIPTION OF THE INVENTION

The inventors examined the above objects and produced a thermoelectric conversion material which included a matrix phase configured from a thermoelectric conversion material, a first grain-boundary phase which was provided at a grain boundary of the matrix phase and was configured from a thermoelectric conversion material (first additive material), and a second grain-boundary phase which was provided at the grain boundary of the matrix phase and was configured from a thermoelectric conversion material (second additive material) having resistance which was lower than that of the matrix phase or the first grain-boundary phase, as a thermoelectric conversion material having a composite material structure in which reducing thermal conductivity could be expected.

As a result of the examination based on analysis and the like of the produced thermoelectric conversion material, the following findings were obtained: a point that a volume ratio of the second grain-boundary phase is desirably equal to or smaller than the volume ratio of the first grain-boundary phase; a point that the matrix phase is desirably a semiconductor as the thermoelectric conversion material; and a point that the first grain-boundary phase is configured by using a material which does not form a compound with the matrix phase by a eutectic reaction, a eutectoid reaction, a peritectic reaction, a peritectoid reaction, an eccentric reaction, or a segregation reaction.

FIG. 1 is a sectional view schematically illustrating a thermoelectric conversion material according to the present invention.

As illustrated in FIG. 1, the thermoelectric conversion material includes a matrix phase 101, a first grain-boundary phase 102, and a second grain-boundary phase 103. Here, the first grain-boundary phase 102 provided at a grain boundary of the matrix phase 101 is formed in order to reduce thermal conductivity of a composite material structure by interfacial thermal resistance between the matrix phase 101 and the first grain-boundary phase 102. Thus, an effect of reducing thermal conductivity is obtained even though first grain-boundary phases 102 are bound to each other in a form of surrounding the matrix phase 101, even though first grain-boundary phases 102 are bound to each other in a form of surrounding the second grain-boundary phase 103, or even though the sizes of the matrix phase 101, the first grain-boundary phase 102, the second grain-boundary phase 103 are not uniform.

A ratio between the first grain-boundary phase 102 and the second grain-boundary phase 103 can be identified, for example, in a manner that the composition of the entirety of a sample is evaluated by using inductive couple plasma (ICP) analysis and the like, and a ratio between a constituent substance of the first grain-boundary phase 102 and a constituent substance of the second grain-boundary phase 103 is evaluated. Locally, for example, the ratio between the first grain-boundary phase 102 and the second grain-boundary phase 103 can be identified, for example, in a manner that distribution of a sample composition in a depth direction is evaluated by using Rutherford back scattering (RBS) analysis and secondary ion mass spectroscopy (SIMS) analysis and the sample composition is evaluated by using energy dispersive X-ray spectroscopy (EDX) analysis. In addition, the value can be identified in a manner that a real image of the sample is observed by using scanning electron microscopy (SEM) analysis or transmission electron microscopy (TEM) analysis.

In the thermoelectric conversion material having the above-described composite material structure, thermal conductivity and specific resistance can be sufficiently small and the Seebeck coefficient can be maintained to a predetermined value. The matrix phase 101 and the first grain-boundary phase 102 do not form a compound in principle. Thus, the thermoelectric conversion material can be used in a heat-treatment process at a high temperature, and a thermoelectric conversion module which uses the thermoelectric conversion material having the composite material structure can be used at a high temperature.

Hereinafter, examples of the present invention will be described with reference to the drawings.

EXAMPLE 1

A thermoelectric conversion material in Example 1 and a thermoelectric conversion module using the thermoelectric conversion material will be described with reference to FIGS. 2A to 6.

FIG. 2A is a sectional view schematically illustrating a main portion (thermoelectric conversion unit) of a thermoelectric conversion module in Example 1. FIG. 2B is a perspective view schematically illustrating the thermoelectric conversion module in Example 1.

The thermoelectric conversion module has a structure in which a plurality of π-type thermoelectric conversion units are arranged on a lower substrate 214. Each of the thermoelectric conversion units includes a p-type thermoelectric conversion material 211, an n-type thermoelectric conversion material 212, and an electrode 213. The thermoelectric conversion module is configured to have a form of a thin film. The p-type thermoelectric conversion material 211 and the n-type thermoelectric conversion material 212 are connected to each other through the electrode 213.

A temperature difference is caused in the thermoelectric conversion module in a direction indicated by an arrow illustrated in FIG. 2B, that is, in an in-plane direction of a thin film, and thus the p-type thermoelectric conversion material 211 and the n-type thermoelectric conversion material 212 generate power. Thus, power based on the temperature difference can be obtained through the electrode 213. The number of thermoelectric conversion units in the thermoelectric conversion module can be randomly selected in accordance with the use.

In the example, thermoelectric conversion performance of the thermoelectric conversion module is improved by using a thermoelectric conversion material which exhibits high thermoelectric conversion performance.

Specifically, the p-type thermoelectric conversion material 211 and the n-type thermoelectric conversion material 212 are thermoelectric conversion materials in which the first grain-boundary phase 102 formed of Si and the second grain-boundary phase 103 formed of Ag are provided at a grain boundary of the matrix phase 101 formed of manganese silicide ($MnSi_{1.7}$).

The n-type thermoelectric conversion material 212 has n-type carriers, and thus substitutes a portion of $MnSi_{1.7}$ with Fe. The amount of $MnSi_{1.7}$ constituting the matrix phase 101 is greater than the total amount of the first grain-boundary phase 102 and the second grain-boundary phase 103. The volume of the first grain-boundary phase 102 is larger than the volume of the second grain-boundary phase 103.

Regarding a combination of the matrix phase 101 and the first grain-boundary phase 102, since a combination by a eutectic reaction occurs even in a case of $Mg_2Si$ and Si, an effect which is similar to a combination of $MnSi_{1.7}$ and Si is shown. Thus, the matrix phase 101 is a semiconductor of a silicon compound and the silicon compound may include at least one kind of element among transition metal (Ti, V, Cr, Mn, Fe, Co, Ni, Cu, Zr, Nb, Mo, La, Ta, and W), alkali metal (Li, Na, K, and Rb), and the Group 2 element (Mg, Ca, Sr, and Ba). Regarding a material constituting the first grain-boundary phase 102, a material which does not form a compound with the matrix phase 101 by a eutectic reaction, a eutectoid reaction, a peritectic reaction, a peritectoid reaction, an eccentric reaction, a segregation reaction, or the like is selected, and thus the similar effect can be confirmed. Regarding the matrix phase 101 and the first grain-boundary phase 102, a portion thereof may be substituted with an element which is different from the constituent element, in order to improve the performance index.

Regarding the combination of the matrix phase 101 and the first grain-boundary phase 102, since a combination by a eutectic reaction occurs even in a case of PbTe and Te, an effect which is similar to a combination of $MnSi_{1.7}$ and Si is shown. Thus, the matrix phase 101 may be a semiconductor of a chalcogenide compound which includes at least one kind of element of the Group 16 element (S, Se, and Te). Regarding a material constituting the first grain-boundary phase 102, a material which does not form a compound with the matrix phase 101 by a eutectic reaction, a eutectoid reaction, a peritectic reaction, a peritectoid reaction, an eccentric reaction, a segregation reaction, or the like is selected, and thus the similar effect can be confirmed. Regarding the matrix phase 101 and the first grain-boundary phase 102, a portion thereof may be substituted with an element which is different from the constituent element, in order to improve the performance index.

Regarding the combination of the matrix phase 101 and the first grain-boundary phase 102, since a combination by a eutectic reaction occurs even in a case of $CoSb_3$ and Sb, an effect which is similar to a combination of $MnSi_{1.7}$ and Si is shown. Thus, the matrix phase 101 may be a semiconductor of a skutterudite compound which includes at least one kind of element of the Group 15 element (P, As, Sb, and Bi). Regarding a material constituting the first grain-boundary phase 102, a material which does not form a compound with the matrix phase 101 by a eutectic reaction, a eutectoid reaction, a peritectic reaction, a peritectoid reaction, an eccentric reaction, a segregation reaction, or the like is selected, and thus the similar effect can be confirmed. Regarding the matrix phase 101 and the first grain-boundary phase 102, a portion thereof may be substituted with an element which is different from the constituent element, in order to improve the performance index.

The reason of the thermoelectric conversion performance of the thermoelectric conversion material used in the example being improved will be described below. In the example, a thin film was formed by using a magnetron sputtering method, and a thermoelectric conversion-material thin film was produced by performing heat treatment at 800° C. The produced thin film was formed on a sapphire substrate.

FIG. 3 is a diagram illustrating a sectional high-angle annular dark field scanning TEM (HAADF-STEM image) of the thin film produced in Example 1.

Regarding the thin film illustrated in FIG. 3, a Si/Mn composition ratio is 2.3 and a Ag/Mn composition ratio is 0.2. In the HAADF-STEM image, a heavy element is displayed bright and a light element is displayed dark. Along with a result of EDX analysis, a white bright-field portion indicates Ag, a gray area indicates $MnSi_{1.7}$, and a black dark-field portion indicates Si. From XRD analysis and the like, the entirety of Mn in the thin film becomes $MnSi_{1.7}$ by heat treatment. Thus, in the thin film, $MnSi_{1.7}$ functions as the matrix phase 101, Si functions as the first grain-boundary phase 102, and Ag functions as the second grain-boundary phase 103. The volume of the second grain-boundary phase 103 is smaller than the volume of the first grain-boundary phase 102, and thus second grain-boundary phases 103 maintain a granular shape without being brought close to each other. Thermal conductivity $\kappa_{ph}$ of the produced thin film is 2.4 W/Km and thermal conductivity $\kappa$ of only the matrix phase 101 is about from 2.5 W/Km to 4.0 W/Km. Thus, it is understood that the thermal conductivity $\kappa_{ph}$ is more reliably decreased by the composite material structure.

Since the matrix phase 101 and the first grain-boundary phase 102 select a combination of materials which do not form a compound with each other, it is possible to efficiently reduce the thermal conductivity without collapsing an interface structure between the matrix phase 101 and the first grain-boundary phase 102. In addition, since the interface structure is not collapsed even if the thermoelectric conversion unit produced in the example is used at a high temperature, it is possible to maintain the thermoelectric performance of the thermoelectric conversion material.

FIG. 4 is a graph illustrating dependency of the thin film produced in Example 1, between a change of specific resistance $\rho$ with a temperature and the amount of the second grain-boundary phase 103. FIG. 5 is a graph illustrating dependency of the thin film produced in Example 1, between a change of the Seebeck coefficient S with a temperature and the amount of the second grain-boundary phase 103. Here, in the produced thin film, the volumes of the matrix phase 101 and the first grain-boundary phase 102 are maintained to be constant and the volume of the second grain-boundary phase 103 is changed.

Symbols in the graphs in FIGS. 4 and 5 indicate the ratio of the volume of the second grain-boundary phase 103 to the total volume of the matrix phase 101 and the first grain-boundary phase 102.

As illustrated in FIG. 4, the specific resistance $\rho$ is decreased monotonously as the amount of the second grain-boundary phase 103 is increased. The reason is because Ag functioning as the second grain-boundary phase 103 has resistance which is lower than that of $MnSi_{1.7}$ functioning as the matrix phase 101 and Si functioning as the first grain-boundary phase 102.

As illustrated in FIG. 5, the Seebeck coefficient S is not largely changed even though the amount of the second grain-boundary phase 103 is increased. The reason is considered as follows. Since the volume of the second grain-boundary phase 103 having a small Seebeck coefficient S is smaller than the volume of the first grain-boundary phase 102, second grain-boundary phases 103 are not brought close to each other. As a result, a thermoelectromotive force hardly influences the second grain-boundary phase 103 and the thermoelectromotive force is defined by the matrix phase 101 having a large Seebeck coefficient S.

For comparison, a change in the specific resistance $\rho$ and the Seebeck coefficient S in a case where the volume ratio of the second grain-boundary phase 103 to the first grain-boundary phase 102 is changed is also examined.

FIG. 6 is a graph illustrating dependency of the thin film produced in Example 1, between the change of specific resistance $\rho$ with a temperature and the amount of the second grain-boundary phase 103. FIG. 7 is a graph illustrating dependency of the thin film produced in Example 1, between the change of the Seebeck coefficient S with a temperature and the amount of the second grain-boundary phase 103. Here, in the produced thin film, the volume of the matrix phase 101 and the total volume of the first grain-boundary phase 102 and the second grain-boundary phase 103 are maintained to be constant, and the volume ratio of the second grain-boundary phase 103 to the first grain-boundary phase 102 is changed.

Symbols in the graphs in FIGS. 6 and 7 indicate the ratio of the volume of the second grain-boundary phase 103 to the volume of the first grain-boundary phase 102.

As illustrated in FIG. 6, the specific resistance $\rho$ is decreased monotonously as the amount of the second grain-boundary phase 103 is increased. The reason is because Ag functioning as the second grain-boundary phase 103 has resistance which is lower than that of Si functioning as the first grain-boundary phase 102.

As illustrated in FIG. 7, if the volume ratio (Ag/Si) of the second grain-boundary phase 103 to the first grain-boundary phase 102 is greater than 1, the Seebeck coefficient S is rapidly decreased. Regarding this, it is considered as follows. Since the volume of the second grain-boundary phase 103 having a small Seebeck coefficient S becomes greater than that of the first grain-boundary phase 102, second grain-boundary phases 103 are brought close to each other. As a result, the thermoelectromotive force is reduced.

From the above consideration, in order not to reduce the Seebeck coefficient S of a thermoelectric conversion material having a composite material structure which is obtained by adding the material constituting the second grain-boundary phase 103, it is desirable that the volume of the second grain-boundary phase 103 having a small Seebeck coefficient S is set to be equal to or smaller than the volume of the first grain-boundary phase 102.

FIG. 8 is a graph illustrating dependency between the Seebeck coefficient and the temperature, for each kind of material constituting the second grain-boundary phase 103 included in the thermoelectric conversion material in Example 1.

For example, even if the material constituting the second grain-boundary phase 103 is, for example, Cu, the second grain-boundary phase 103 has resistance which is lower than that of the matrix phase 101 and the first grain-boundary phase 102, an effect which is similar to that in a case of Ag is shown. Meanwhile, if the second grain-boundary phase 103 substitutes a portion of the matrix phase 101 with another element, the Seebeck coefficient S is significantly decreased.

It is known that, in $MnSi_{1.7}$ as the matrix phase 101, Si is hardly subjected to element substitution, but Mn is subjected to element substitution by transition metal of Group 5 to Group 9. Thus, it is considered that Ag and Cu do not perform element substitution on the matrix phase 101, but Ta performs element substitution on some of Mn sites.

As illustrated in FIG. 8, the Seebeck coefficient S of a thin film in which Ag and Cu are added is not largely changed in comparison to the Seebeck coefficient S of a thin film in which a material to function as the second grain-boundary phase 103 is not added. It is understood that the Seebeck coefficient S of a thin film in which Ta is added is largely decreased in comparison to Seebeck coefficients S of other thin films.

From the above consideration, it is desirable that the second grain-boundary phase 103 is a material which has resistance lower than that of the matrix phase 101 or the first grain-boundary phase 102 and does not perform element substitution on a portion of the matrix phase 101. In the example, the second grain-boundary phase 103 may be a compound which has resistance lower than that of the matrix phase 101 or the second grain-boundary phase 103, and includes an element other than transition metal of Group 5 to Group 9 or an element of Group 5 to Group 5.

For example, even if the first grain-boundary phase 102 is SiGe, Ge has resistance lower than Si and does not substitute some of elements in the matrix phase 101 with other elements, and the Seebeck coefficient S of a thermoelectric conversion material having the composite material structure is dominantly determined by the matrix phase 101. Thus, it is possible to decrease the specific resistance ρ without reducing the Seebeck coefficient S of the thermoelectric conversion material. Thus, the first grain-boundary phase 102 may be a compound including at least one kind of element among the Group 13 element including Al, Ga, In, and Tl, the Group 14 element including Ge, Sn, and Fb, and the Group 15 element including P, As, Sb, and Bi.

Regarding the thermoelectric conversion material used in the example, materials which respectively constitute the matrix phase 101 and the first grain-boundary phase 102 are selected so as to obtain a high performance index ZT, and a material controls a structure of the second grain-boundary phase 103. The thermoelectric conversion materials are not limited to a method of producing a thin film. For example, a thin film may be produced by using a thin-film producing method such as a molecular beam epitaxy (MBE) method, a pulse laser deposition (PLD) method, and a chemical vapor deposition (CVD) method.

Since materials which do not form a compound with each other are selected for the matrix phase 101 and the first grain-boundary phase 102, a heat treatment temperature is not limited to 800° C. in the example, and it is possible to maximize thermoelectric performance by designating the best heat treatment temperature in accordance with a material and a structure.

According to Example 1, it is possible to provide a thermoelectric conversion material which has low thermal conductivity and a high output factor and is stable at a high temperature regardless of the composite material structure, and a thermoelectric conversion module using the thermoelectric conversion material.

EXAMPLE 2

Example 2 of the present invention will be described with reference to FIGS. 9A and 9B. Items described in Example 1 will not be repeated. The items can also be applied to Example 2 so long as the particular statements are not made.

FIG. 9A is a sectional view schematically illustrating a main portion of a thermoelectric conversion module in Example 2. FIG. 9B is a perspective view schematically illustrating the thermoelectric conversion module in Example 2.

The thermoelectric conversion module has a structure in which a plurality of π-type thermoelectric conversion units are arranged between a lower substrate 224 and an upper substrate 225. Each of the thermoelectric conversion units includes a p-type thermoelectric conversion material 221, an n-type thermoelectric conversion material 222, and an electrode 223. The p-type thermoelectric conversion material 221 and the n-type thermoelectric conversion material 222 are bulk materials.

A temperature difference is caused in the thermoelectric conversion module in a direction indicated by an arrow illustrated in FIG. 9B, and thus the p-type thermoelectric conversion material 221 and the n-type thermoelectric conversion material 222 generate power. Thus, power based on the temperature difference can be obtained through the electrode 223.

In the example, thermoelectric conversion performance of the thermoelectric conversion module is improved by using a thermoelectric conversion material which exhibits high thermoelectric conversion performance.

Specifically, the p-type thermoelectric conversion material 221 and the n-type thermoelectric conversion material 222 are thermoelectric conversion materials in which the first grain-boundary phase 102 formed of Si and the second grain-boundary phase 103 formed of Ag are provided at a grain boundary of the matrix phase 101 formed of manganese silicide ($MnSi_{1.7}$). The electrode 223 is configured with Cu. The lower substrate 224 and the upper substrate 225 are configured with AlN.

The n-type thermoelectric conversion material 222 has n-type carriers, and thus substitutes a portion of $MnSi_{1.7}$ with Fe. The amount of $MnSi_{1.7}$ constituting the matrix phase 101 is greater than the total amount of the first grain-boundary phase 102 and the second grain-boundary phase 103. The volume of the first grain-boundary phase 102 is larger than the volume of the second grain-boundary phase 103.

Here, the p-type thermoelectric conversion material 221 and the n-type thermoelectric conversion material 222 are produced in a manner that element powder is pulverized by a mechanical alloying method and the resultant is sintered by a spark plasma method for a short time. By employing these methods, particles of $MnSi_{1.7}$ which is the parent material of the sintered body can be reduced up to 1 μm or smaller. As a result, thermal conductivity κ is decreased. A sintering temperature is 800° C. and a sintering time is 600 seconds.

Since materials which do not form a compound with each other are selected for the matrix phase 101 and the first grain-boundary phase 102, a heat treatment temperature is not limited to 800° C. in the example, and it is possible to maximize thermoelectric performance by designating the best heat treatment temperature in accordance with a material and a structure.

A heat treatment time is also not limited to 600 seconds in the example, and it is possible to maximize thermoelectric performance by designating the best heat treatment time in accordance with a material and a structure.

According to Example 2, it is possible to provide a thermoelectric conversion material of a sintered body having an effect which is similar to that in Example 1, and a thermoelectric conversion module using the thermoelectric conversion material.

EXAMPLE 3

Example 3 of the present invention will be described with reference to FIG. 10. Items described in Examples 1 and 2 will not be repeated. The items can also be applied to Example 3 so long as the particular statements are not made.

FIG. 10 is a sectional view schematically illustrating a main portion of a thermoelectric conversion module in Example 3.

The thermoelectric conversion module has a structure in which a plurality of unileg-type thermoelectric conversion units are arranged between a lower substrate 234 and an upper substrate 235. Each of the thermoelectric conversion units includes a thermoelectric conversion material 231 and an electrode 233. The thermoelectric conversion material 231 is a bulk material, and may be any of a p-type thermoelectric conversion material and an n-type thermoelectric conversion material.

In the example, thermoelectric conversion performance of the thermoelectric conversion module is improved by using a thermoelectric conversion material which exhibits high thermoelectric conversion performance.

Specifically, the thermoelectric conversion material 231 is a thermoelectric conversion material in which the first grain-boundary phase 102 formed of Si and the second grain-boundary phase 103 formed of Ag are provided at a grain boundary of the matrix phase 101 formed of manganese silicide ($MnSi_{1.7}$).

The amount of $MnSi_{1.7}$ constituting the matrix phase 101 is greater than the total amount of the first grain-boundary phase 102 and the second grain-boundary phase 103. The volume of the first grain-boundary phase 102 is larger than the volume of the second grain-boundary phase 103.

According to Example 3, it is possible to provide a thermoelectric conversion material having an effect which is similar to that in Examples 1 and 2, and a thermoelectric conversion module using the thermoelectric conversion material.

EXAMPLE 4

Example 4 of the present invention will be described with reference to FIG. 11. Items described in Examples 1 to 3 will not be repeated. The items can also be applied to Example 4 so long as the particular statements are not made.

FIG. 11 is a sectional view schematically illustrating a main portion of a thermoelectric conversion module in Example 4.

The thermoelectric conversion module has a structure in which a plurality of unileg-type thermoelectric conversion units are arranged between a lower substrate 244 and an upper substrate 245. Each of the thermoelectric conversion units includes a p-type thermoelectric conversion material 241, an n-type thermoelectric conversion material 242, an electrode 243, and an interlayer insulating film 246. The thermoelectric conversion module is configured to have a form of a thin film.

In the example, thermoelectric conversion performance of the thermoelectric conversion module is improved by using a thermoelectric conversion material which exhibits high thermoelectric conversion performance.

Specifically, the p-type thermoelectric conversion material 241 and the n-type thermoelectric conversion material 242 are thermoelectric conversion materials in which the first grain-boundary phase 102 formed of Si and the second grain-boundary phase 103 formed of Ag are provided at a grain boundary of the matrix phase 101 formed of manganese silicide ($MnSi_{1.7}$).

The n-type thermoelectric conversion material 242 has n-type carriers, and thus substitutes a portion of $MnSi_{1.7}$ with Fe. The amount of $MnSi_{1.7}$ constituting the matrix phase 101 is greater than the total amount of the first grain-boundary phase 102 and the second grain-boundary phase 103. The volume of the first grain-boundary phase 102 is larger than the volume of the second grain-boundary phase 103.

According to Example 4, it is possible to provide a thermoelectric conversion material having an effect which is similar to that in Examples 1 to 3, and a thermoelectric conversion module using the thermoelectric conversion material.

EXAMPLE 5

Example 5 of the present invention will be described with reference to FIG. 12. Items described in Examples 1 to 4 will not be repeated. The items can also be applied to Example 5 so long as the particular statements are not made.

FIG. 12 is a sectional view schematically illustrating a main portion of a thermoelectric conversion module in Example 5.

The thermoelectric conversion module has a structure in which a plurality of transverse type thermoelectric conversion units are arranged between a lower substrate 254 and an upper substrate 255. Each of the thermoelectric conversion units includes a p-type thermoelectric: conversion material 251, an n-type thermoelectric: conversion material 252, an electrode 253, and an interlayer insulating film 256. The thermoelectric conversion module is configured to have a form of a thin film.

In the example, thermoelectric conversion performance of the thermoelectric conversion module is improved by using a thermoelectric conversion material which exhibits high thermoelectric conversion performance.

Specifically, the p-type thermoelectric conversion material 251 and the n-type thermoelectric conversion material 252 are thermoelectric conversion materials in which the first grain-boundary phase 102 formed of Si and the second grain-boundary phase 103 formed of Ag are provided at a grain boundary of the matrix phase 101 formed of manganese silicide ($MnSi_{1.7}$).

The n-type thermoelectric conversion material 252 has n-type carriers, and thus substitutes a portion of $MnSi_{1.7}$ with Fe. The amount of $MnSi_{1.7}$ constituting the matrix phase 101 is greater than the total amount of the first grain-boundary phase 102 and the second grain-boundary phase 103. The volume of the first grain-boundary phase 102 is larger than the volume of the second grain-boundary phase 103.

According to Example 5, it is possible to provide a thermoelectric conversion material having an effect which is similar to that in Examples 1 to 4, and a thermoelectric conversion module using the thermoelectric conversion material.

The present invention is not limited to the above-described examples, and includes various modification examples. For example, the above-described examples are specifically described in order to explain the present invention so as to easily understand the present invention and are not necessarily limited to those including all the configurations described above. In addition, a portion of the configuration of one embodiment can be replaced with the configuration of another embodiment, and the configuration of another embodiment can be added to the configuration of one embodiment. Regarding a portion of the configuration of each of the examples, addition, deletion, and replacement of another configuration can be performed.

What is claimed is:

1. A thermoelectric conversion material comprising:
a matrix phase configured from a semiconductor of any of a silicon compound, a chalcogenide compound, and a skutterudite compound,
wherein a first grain-boundary phase and a second grain-boundary phase are provided at a grain boundary of the matrix phase,
the first grain-boundary phase is configured from a material which does not form a compound with the matrix phase by a eutectic reaction, a eutectoid reaction, a peritectic reaction, a peritectoid reaction, an eccentric reaction, or a segregation reaction, such that thermal conductivity of the thermoelectric conversion material is reduced without collapsing an interface structure between the matrix phase and the first grain-boundary phase,
the second grain-boundary phase is configured from a material having resistance which is lower than that of the matrix phase or the first grain-boundary phase, and
a ratio of a volume of the second grain-boundary phase to a volume of the first grain-boundary phase is smaller than 1 such that second grain-boundary phases maintain a granular shape without aggregating.

2. The thermoelectric conversion material according to claim 1,
wherein the matrix phase is configured from a semiconductor of the silicon compound, and
the silicon compound includes at least one kind of element among transition metal including Ti, V, Cr, Mn, Fe, Co, Ni, Cu, Zr, Nb, Mo, La, Ta, and W, alkali metal including Li, Na, K, and Rb, and a Group 2 element including Mg, Ca, Sr, and Ba.

3. The thermoelectric conversion material according to claim 1,
wherein the matrix phase is configured from a semiconductor of the chalcogenide compound, and
the chalcogenide compound includes at least one kind of element of a Group 16 element including S, Se, and Te.

4. The thermoelectric conversion material according to claim 1,
wherein the matrix phase is configured from a semiconductor of the skutterudite compound, and
the skutterudite compound includes at least one kind of element of a Group 15 element including P, As, and Sb.

5. The thermoelectric conversion material according to claim 1,
wherein the matrix phase is configured from a semiconductor of the silicon compound, and
the first grain-boundary phase includes at least one kind of element among a Group 13 element including Al, Ga, In, and Tl, a Group 14 element including Ge, Sn, and Pb, and a Group 15 element including P, As, Sb, and Bi.

6. The thermoelectric conversion material according to claim 1,
wherein the second grain-boundary phase includes an element other than transition metal of Group 5 to Group 9 or an element of Group 5 to Group 9.

7. A thermoelectric conversion module comprising:
a thermoelectric conversion unit which includes at least one electrode and a plurality of the thermoelectric conversion materials according to claim 1,
wherein each of the plurality of thermoelectric conversion materials is connected to at least one thermoelectric conversion material through the at least one electrode.

8. The thermoelectric conversion module according to claim 7,
wherein a structure of the thermoelectric conversion unit is at least any one of a $\pi$ type, a unileg type, and a transverse type.

9. A thermoelectric conversion material comprising:
a matrix phase configured from a semiconductor,
wherein a first grain-boundary phase and a second grain-boundary phase are provided at a grain boundary of the matrix phase,
the first grain-boundary phase is configured from a material which does not form a compound with the matrix phase by a eutectic reaction, a eutectoid reaction, a peritectic reaction, a peritectoid reaction, an eccentric reaction, or a segregation reaction, such that thermal conductivity of the thermoelectric conversion material is reduced without collapsing an interface structure between the matrix phase and the first grain-boundary phase,
the second grain-boundary phase is configured from a material having resistance which is lower than that of the matrix phase or the first grain-boundary phase, and
a ratio of a volume of the second grain-boundary phase to a volume of the first grain-boundary phase is smaller than 1 such that second grain-boundary phases maintain a granular shape without aggregating.

10. A thermoelectric conversion module comprising:
a thermoelectric conversion unit which includes at least one electrode and a plurality of the thermoelectric conversion materials according to claim 9,
wherein each of the plurality of thermoelectric conversion materials is connected to at least one thermoelectric conversion material through the at least one electrode.

11. The thermoelectric conversion module according to claim 10,
wherein a structure of the thermoelectric conversion unit is at least any one of a $\pi$ type, a unileg type, and a transverse type.

* * * * *